US009201097B1

(12) United States Patent
Vodrahalli

(10) Patent No.: US 9,201,097 B1
(45) Date of Patent: Dec. 1, 2015

(54) METHOD AND APPARATUS FOR TESTING INTEGRATED CIRCUIT DIE WITH A PARTIALLY COMPLETED AND VALIDATED MODULE

(71) Applicant: Altera Corporation, San Jose, CA (US)

(72) Inventor: Nagesh Vodrahalli, Los Altos, CA (US)

(73) Assignee: Altera Corporation, San Jose, CA (US)

( * ) Notice: Subject to any disclaimer, the term of this patent is extended or adjusted under 35 U.S.C. 154(b) by 332 days.

(21) Appl. No.: 13/651,269

(22) Filed: Oct. 12, 2012

(51) Int. Cl.
*G01R 31/20* (2006.01)
*G01R 1/073* (2006.01)
*G01R 31/28* (2006.01)
*G01R 1/067* (2006.01)

(52) U.S. Cl.
CPC ........ *G01R 1/07342* (2013.01); *G01R 1/06772* (2013.01); *G01R 31/2886* (2013.01); *G01R 31/2889* (2013.01)

(58) Field of Classification Search
None
See application file for complete search history.

(56) References Cited

U.S. PATENT DOCUMENTS

| | | | | |
|---|---|---|---|---|
| 5,172,049 | A | | 12/1992 | Kiyokawa et al. |
| 5,468,994 | A | * | 11/1995 | Pendse ........................... 257/693 |
| 6,517,656 | B1 | * | 2/2003 | DiCaprio ....................... 156/235 |
| 7,345,361 | B2 | * | 3/2008 | Mallik et al. ................... 257/686 |
| 7,883,938 | B2 | | 2/2011 | Kolan et al. |
| 2003/0001287 | A1 | * | 1/2003 | Sathe ............................. 257/780 |
| 2003/0151883 | A1 | | 8/2003 | Hauptman |
| 2004/0100293 | A1 | | 5/2004 | Bottcher et al. |
| 2009/0289253 | A1 | | 11/2009 | Pendse |
| 2010/0231251 | A1 | | 9/2010 | Nelson et al. |
| 2011/0024890 | A1 | * | 2/2011 | Yang et al. ..................... 257/686 |
| 2011/0042820 | A1 | | 2/2011 | Knickerbocker |
| 2011/0062599 | A1 | | 3/2011 | Kim et al. |
| 2011/0308080 | A1 | | 12/2011 | Hedge |
| 2012/0225522 | A1 | * | 9/2012 | Zhao et al. ..................... 438/107 |

FOREIGN PATENT DOCUMENTS

WO 2005/089421 9/2005

OTHER PUBLICATIONS

U.S. Appl. No. 13/651,288, "Method and apparatus for testing a flip-chip assembly during manufacture," Nagesh Vodrahalli, filed Oct. 12, 2012.
U.S. Appl. No. 13/651,288, Office Action mailed Apr. 4, 2014.
U.S. Appl. No. 13/651,288, Office Action mailed Sep. 11, 2014.
U.S. Appl. No. 13/651,288, Office Action mailed Apr. 23, 2015.

* cited by examiner

*Primary Examiner* — Jermele M Hollington
(74) *Attorney, Agent, or Firm* — Weaver Austin Villeneuve & Sampson LLP

(57) ABSTRACT

Techniques for electrically testing an integrated circuit (IC) die with a partially completed and validated module (module) include providing an IC die to be tested on an IC package substrate of a validated test module, the positioned IC die and the module forming a multi-die flip-chip test assembly, and without attaching the interconnection bumps of the IC die to the package pads of the module, electrically testing the multi-die flip-chip test assembly. The method may further involve, responsive to the multi-die flip-chip test assembly passing electrical testing positioning the IC die on a production IC package substrate and attaching the IC die to the production IC package substrate. Corresponding apparatus and systems can also be used to perform the technique.

12 Claims, 7 Drawing Sheets

METHOD AND APPARATUS FOR TESTING INTEGRATED CIRCUIT DIE WITH A PARTIALLY COMPLETED AND VALIDATED MODULE

TECHNICAL FIELD

The present disclosure generally relates to integrated circuit package manufacturing. More specifically, the present disclosure relates to techniques and systems for electrically testing an integrated circuit (IC) die designed for a multi-die flip-chip package or assembly using a partially completed and validated module.

DESCRIPTION OF RELATED ART

A multi-die flip-chip package or assembly conventionally includes two or more IC dice that are attached to a package substrate, or IC package substrate. In a common example, each IC die includes interconnection bumps deposited on a surface while the package substrate includes corresponding package pads on a first surface for each of the IC dice. When the interconnection bumps and the package pads are placed in conductive contact, they allow signal transfers between the IC dice and the package substrate.

In a conventional flip-chip manufacture process, multiple IC dice may be fabricated on a wafer and tested. The wafer test is usually kept simple to enhance throughput and discourage false negative results. A wafer that has passed testing may then be diced, where individual IC dice are cut from the wafer.

Next, IC dice, fabricated from the same wafer or from different wafers, are placed on an IC package substrate for attachment. Conventionally, each IC die is positioned on the package substrate such that its interconnection bumps are facing and aligned with corresponding package pads on the IC package substrate. In one example, the interconnection bumps and package pads are made from solder. Here, heat may be applied to cause solder reflow such that the interconnection bumps permanently attach to the package pads. Once attached, the IC dice and IC package substrate form a production multi-die flip-chip package, also referred to herein as a production multi-die flip-chip assembly.

Following attachment, the production multi-die flip-chip assembly is electrically tested. This electrical test is more comprehensive than the wafer test, and may include full functional and performance tests of the IC dice, the IC package substrate and their interconnections. Conventionally, testing a production multi-die flip-chip assembly is conducted using a package test tool that is separate from the tool that attaches the IC dice to the IC package substrate.

If the flip-chip assembly fails electrical testing, it may be placed in a rework process in which one or more IC dice responsible for the failure are removed from the IC package substrate. This process is costly, and oftentimes, it is economically preferable to discard the entire production multi-die flip-chip assembly. However, this solution becomes increasingly inefficient as more IC dice are placed on an IC package substrate because the failure of even a single IC die results in the entire assembly being discarded.

OVERVIEW

The present invention relates to techniques apparatus and systems for electrically testing an integrated circuit (IC) die with a partially completed and validated module (module). Methods according to the present invention involve providing an IC die to be tested on an IC package substrate of a validated test module, the positioned IC die and the module forming a multi-die flip-chip test assembly, and without attaching the interconnection bumps of the IC die to the package pads of the module, electrically testing the multi-die flip-chip test assembly. The method may further involve, responsive to the multi-die flip-chip test assembly passing electrical testing positioning the IC die on a production IC package substrate and attaching the IC die to the production IC package substrate.

It should be appreciated that the term "flip-chip" in the context of the present application is intended to encompass a variety of surface-to-surface die-to-substrate attach technologies. These include conventional solder bump-based flip chip technologies, such as C4 technology, as well as related technologies using lead-free or conductive epoxy materials, for example, as alternatives to conventional solder, and also copper pillar bump (CPB) technology. "Flip-chip" should be attributed this broad meaning in this application.

In some embodiments, a method in accordance with the present invention provides for electrically testing an integrated circuit (IC) die with a partially completed and validated module (module). The method may include providing the module including: an IC package substrate, one or more of known good IC dice attached on a first surface of the IC package substrate at first regions, and package pads on the first surface of the IC package substrate at a second region. The method may further include providing the IC die to be tested with a surface having interconnection bumps, positioning the IC die on the second region of the IC package substrate such that the interconnection bumps are facing and aligned with the package pads of the module, the positioned IC die and the module forming a multi-die flip-chip test assembly; and without attaching the interconnection bumps of the IC die to the package pads of the module, electrically testing the multi-die flip-chip test assembly.

In some embodiments, the method further includes applying pressure to the positioned IC die such that the IC die is held in position on the second region of the IC package substrate and the interconnection bumps make conductive contact with the package pads.

In some embodiments, applying pressure to the positioned IC die is done such that the IC die is held in position on the second region of the IC package substrate and the interconnection bumps make conductive contact with the package pads includes applying pressure to the positioned IC die with a pick and place tool that also performs the positioning of the IC die on the second region of the IC package substrate.

In some embodiments, the module further includes package bumps on a second surface of the IC package substrate, and the method further involves positioning the module on a substrate part holder such that the package bumps are facing and aligned with test socket pads on a surface of the substrate part holder.

In some embodiments, the method further includes applying pressure to the positioned module such that the module is held in position on the surface of the substrate part holder and the package bumps make conductive contact with the test socket pads.

In some embodiments, applying pressure to the module is done such that the module is held in position on the surface of the substrate part holder and the package bumps make conductive contact with the test socket pads includes vacuum mounting the module to the surface of the substrate part holder.

In some embodiments, the method further includes applying pressure to the positioned IC die such that the IC die is held in position on the second region of the IC package substrate and the interconnection bumps make conductive contact with the package pads, wherein applying pressure to the positioned module or applying pressure to the positioned IC die is performed with a clamp.

In some embodiments, the method further includes, after electrically testing the multi-die flip-chip test assembly, lifting the IC die from the module, thereby allowing a second IC die to be positioned on the module for testing.

In some embodiments, the method further, responsive to the multi-die flip-chip test assembly passing electrical testing, positioning the IC die on a second region of a production IC package substrate such that the interconnection bumps of the IC die are facing and aligned with production package pads of the production IC package substrate, and attaching the IC die to the production IC package substrate. In some embodiments, the interconnection bumps of the IC die are made from solder, and the method further involves not applying flux between the IC die and the module.

In some embodiments, the positioning of the IC die on the second region of the IC package substrate of the module is performed with a pick and place tool and wherein the module further includes package bumps on a second surface of the package substrate. According to this embodiment, the method may further involve positioning, with the pick and place tool, the module on a substrate part holder such that the package bumps are facing and aligned with test socket pads on a surface of the substrate part holder, and, responsive to the flip-chip assembling passing electrical testing: lifting, with the pick and place tool, the IC die from the module, positioning, with the pick and place tool, a production IC package substrate on a heated platform, the production IC package substrate including production package pads corresponding with the production pads of the module, positioning, with the pick and place tool, the IC die on the positioned production IC package substrate such that the interconnection bumps are facing and aligned with the production package pads, and applying heat, with the heated platform, to attach the IC die to the production IC package substrate, wherein a pick and place tool positions the module on the substrate part holder, positions the IC die on the module, lifts the IC die from the module. According to this embodiment, the module, the pick and place tool, the heated platform and the substrate part holder may be components of an integrated testing and assembly tool.

In other embodiments, an apparatus in accordance with the present invention for electrically testing an IC die includes a partially completed and validated module (module) including: an IC package substrate, one or more known good IC dice attached on a first surface of the IC package substrate at first regions, and package pads on the first surface of the IC package substrate at a second region. The apparatus further includes a pick and place tool configured to position the IC die on the second region of the IC package substrate such that interconnection bumps of the IC die are facing and aligned with the package pads of the module, the positioned IC die and the module forming a multi-die flip-chip test assembly, and test circuitry operable to electrically test the multi-die flip-chip test assembly without the IC die being attached to the module.

In some embodiments, the apparatus includes one or more pressure application mechanisms configured to apply pressure to the positioned IC die such that the IC die is held in position on the second region of the IC package substrate and the interconnection bumps make conductive contact with the package pads. In some embodiments, at least one of the one or more pressure application mechanisms is the pick and place tool.

In some embodiments, the module further includes package bumps on a second surface of the IC package substrate and wherein the pick and place tool is further configured to position the module on a substrate part holder such that the package bumps are facing and aligned with test socket pads on a surface of the substrate part holder.

In some embodiments, the apparatus further includes one or more pressure application mechanisms configured to apply pressure to the positioned module such that the module is held in position on the surface of the substrate part holder and the package bumps make conductive contact with the test socket pads. In some embodiments, at least one of the one or more pressure application mechanisms is a vacuum mount. In some embodiments, at least one of the one or more pressure application mechanisms is a clamp.

In some embodiments, the pick and place tool may be further configured to lift the IC die from the module after the multi-die flip-chip test assembly has been electrically tested, thereby allowing a second IC die to be positioned on the module for testing.

In some embodiments, the apparatus may further include a heated platform, wherein responsive to the multi-die flip-chip test assembly passing electrical testing, the pick and place tool is further configured to position the IC die on a second region of a production IC package substrate such that the interconnection bumps of the IC die are facing and aligned with production package pads of the production IC package substrate, and the heated platform is configured to attach the IC die to the production IC package substrate.

In other embodiments, a system in accordance with the present invention for electrically testing an IC die includes a partially completed and validated module (module) including an IC package substrate, one or more known good IC dice attached on a first surface of the IC package substrate at first regions, and package pads on the first surface of the IC package substrate at a second region. The system may further include a pick and place tool, test circuitry electrically connected with the module, and a controller. The controller may have one or more memory devices and one or more processors, the one or more memory devices storing instructions executable by the one or more processors such that the controller is configured to control the pick and place tool to position the IC die on the second region of the IC package substrate such that interconnection bumps of the IC die are facing and aligned with the package pads of the module, the positioned IC die and the module forming a multi-die flip-chip test assembly, and control the test circuitry to electrically test the multi-die flip-chip test assembly without the IC die being attached to the module.

In some embodiments, the system may further include one or more pressure application mechanisms and wherein the controller is further configured to control the one or more pressure application mechanisms to apply pressure to the positioned IC die such that the IC die is held in position on the second region of the IC package substrate and the interconnection bumps make conductive contact with the package pads. In some embodiments, at least one of the one or more pressure application mechanisms is the pick and place tool.

In some embodiments, the module further includes package bumps on a second surface of the IC package substrate and wherein the controller is further configured to control the pick and place tool to position the module on a substrate part holder such that the package bumps are facing and aligned with test socket pads on a surface of the substrate part holder.

In some embodiments, the system further includes one or more pressure application mechanisms and wherein the controller is further configured to control the one or more pressure application mechanisms to apply pressure to the positioned module such that the module is held in position on the surface of the substrate part holder and the package bumps make conductive contact with the test socket pads. In some embodiments, at least one of the one or more pressure application mechanisms is a vacuum mount. In some embodiments, at least one of the one or more pressure application mechanisms is a clamp.

In some embodiments, the controller is further configured to control the pick and place tool to lift the IC die from the module after the multi-die flip-chip test assembly has been electrically tested, thereby allowing a second IC die to be positioned on the module for testing.

In some embodiments, the system further includes a heated platform and the controller is further configured to, responsive to the multi-die flip-chip test assembly passing electrical testing, control the pick and place tool to position the IC die on a second region of a production IC package substrate such that the interconnection bumps of the IC die are facing and aligned with production package pads of the production IC package substrate, and control the heated platform to attach the IC die to the production IC package substrate.

In other embodiments, a flip chip made by a process comprising testing and further comprising assembly as described herein is provided.

BRIEF DESCRIPTION OF THE DRAWINGS

The included drawings are for illustrative purposes and serve only to provide examples of possible structures and process steps for the disclosed subject matter. These drawings in no way limit any changes in form and detail that may be made to embodiments by one skilled in the art without departing from the spirit and scope of the disclosure.

DESCRIPTION OF PARTICULAR EMBODIMENTS

Reference will now be made in detail to embodiments of the present invention. Examples of these embodiments are illustrated in the accompanying drawings. While the invention is described in conjunction with these embodiments, it will be understood that it is not intended to limit the invention to the described embodiments. On the contrary, it is intended to cover alternatives, modifications, and equivalents as may be included within the spirit and scope of the invention as defined by the appended claims.

For example, the techniques and mechanisms of the present invention will be described in the context of particular types of devices. However, it should be noted that the techniques and mechanisms of the present invention apply to a variety of different types of devices. In the following description, numerous specific details are set forth in order to provide a thorough understanding of the present invention. Particular exemplary embodiments of the present invention may be implemented without some or all of these specific details. In other instances, well known process operations have not been described in detail in order not to unnecessarily obscure the present invention.

Various techniques and mechanisms of the present invention will sometimes be described in singular form for clarity. However, it should be noted that various embodiments may include multiple iterations of a technique or multiple instantiations of a mechanism unless noted otherwise. For example, a system may use a processor in a variety of contexts. However, it will be appreciated that a system can use multiple processors while remaining within the scope of the present invention unless otherwise noted. Furthermore, the techniques and mechanisms of the present invention will sometimes describe a connection between two entities. It should be noted that a connection between two entities does not necessarily mean a direct, unimpeded connection, as a variety of other entities may reside between the two entities. For example, a processor may be connected to a memory component, but it will be appreciated that a variety of bridges and controllers may reside between the processor and memory. Consequently, a connection does not necessarily mean a direct, unimpeded connection unless otherwise noted.

Figure 1:
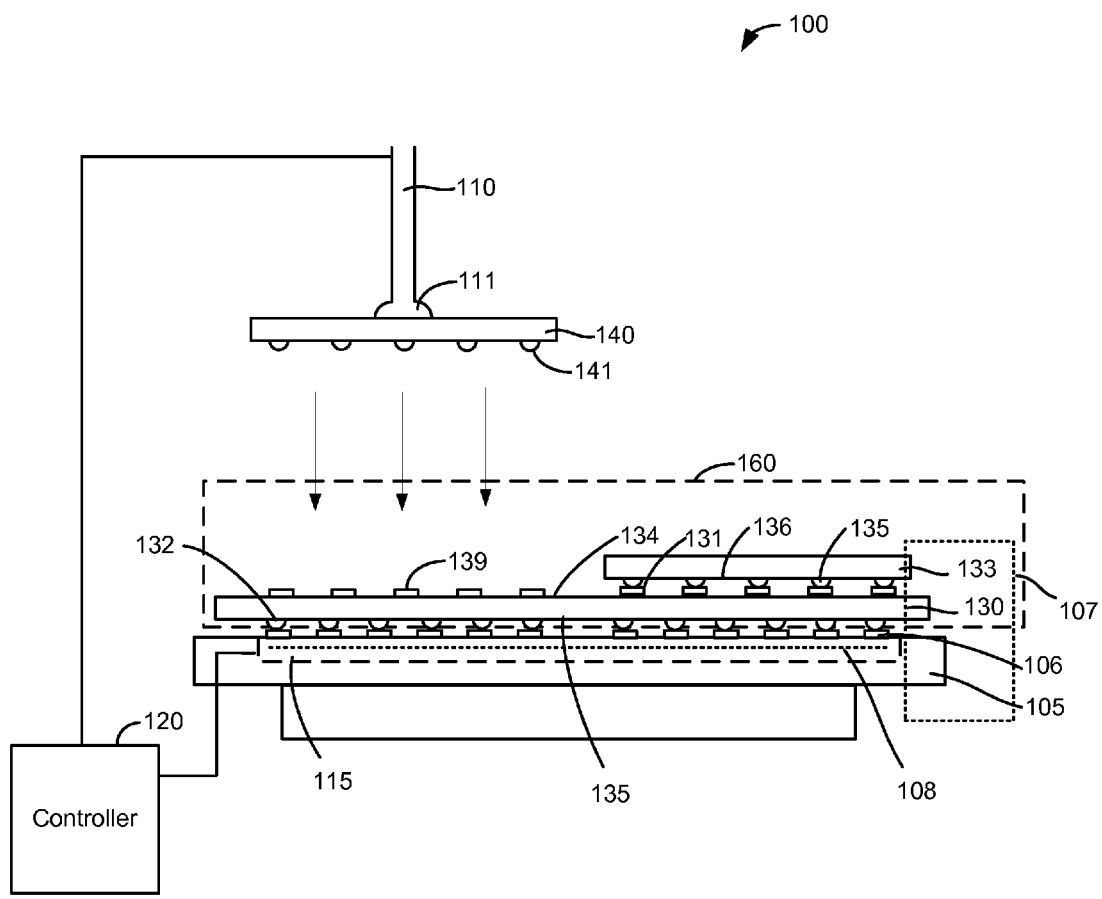
FIG. 1 shows an example of a test apparatus/system 100 for electrically testing an IC die with a partially completed and validated module, configured in accordance with some embodiments.

In some embodiments, a test apparatus provides for electrically testing an IC die with a partially completed and validated module. FIG. 1 shows an example test apparatus 100 (or, "apparatus 100") configured to electrically test IC die 140. Apparatus 100 may include partially completed and validated module 160 (hereinafter, "module 160"), substrate part holder 105, pick and place tool 110, test circuitry 115 and controller 120.

Module 160 may include an IC package substrate 130 and one or more known good IC die 133 attached on first surface 134 of IC package substrate 130. IC package substrate 130 may include package pads 131 on first surface 134 and package pads 132 on second surface 135.

Known good IC die 133 may include interconnection bumps 135 on a surface 136. Furthermore, known good IC die 133 may be positioned on IC package substrate 130 such that interconnection bumps 135 are facing, aligned and in conductive contact with package pads 131.

"Bumps," as used in the art, typically refer to small spheres of conductive material that may bond to conductive contact areas, or "pads." For instance, FIG. 1 shows IC die 133 including interconnection bumps 135 that may bond to package pads 131 of package substrate 130. The conductive material may be made from solder in a preferred embodiment, but other materials may also be used such as conductive epoxies. Furthermore, other structures may be used to form the conductive contacts. For instance, an IC die may include bumps that bond to pads of an IC package substrate. In another example, other structures besides spherical balls may be used to form bumps. Thus as used herein, "bumps" and "pads" may refer to conductive material having a variety of possible structures that are deposited on surfaces for forming conductive contacts and mechanical attachments. In specific embodiments, bumps are made of solder or other material that can be reflowed by application of heat to form a permanent bond with substrate pads.

Returning to module 160 in FIG. 1, interconnection bumps 135 of known good IC die 133 may be further attached to package pads 133 of IC package substrate 130. In some embodiments, interconnection bumps 135 are made from solder, and attachment includes heating module 160 to reflow the solder.

Figure 2:
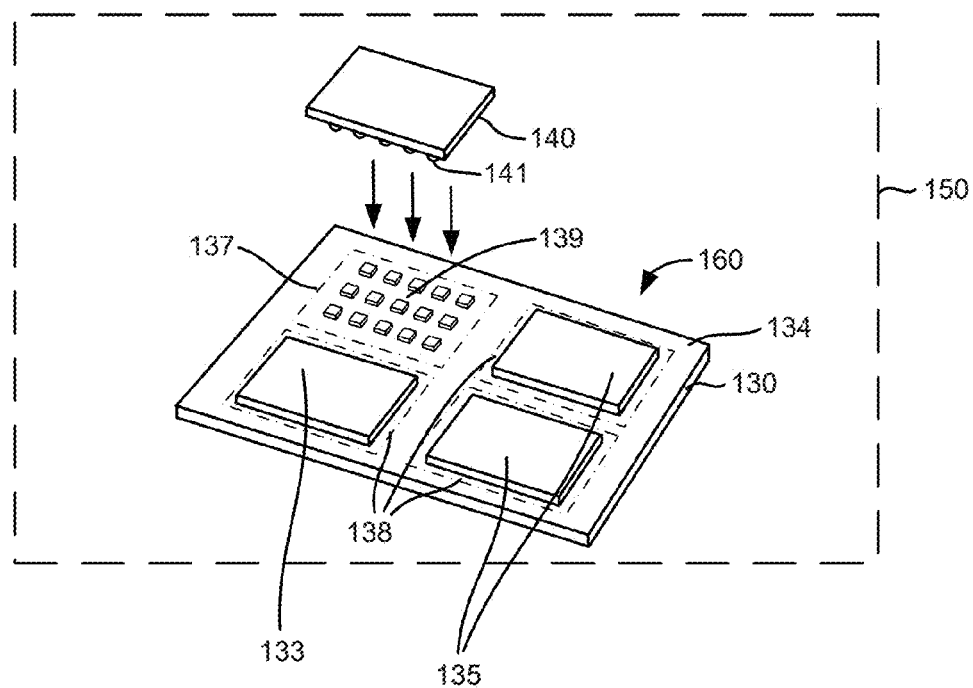
FIG. 2 shows an example partially completed and validated module 160, in accordance with some embodiments.

While FIG. 1 shows only known good IC die 133 attached to IC package substrate 130 in module 160, it will be appreciated that any number of known good IC dice may be attached to IC package substrate 130. For instance, FIG. 2 shows module 160 from a second perspective that includes known good IC die 133 and two other known good IC die 135 attached at regions 138 on surface 134. Known good IC dice 135 may be attached to IC package substrate 133 using similar techniques as those described herein for known good IC die 133.

In some embodiments, the attached known good IC dice may be underfilled or otherwise encapsulated. In one example, the underfill may be made from a non-conductive adhesive material. Underfilling provides mechanical support, protection and electrical isolation to components of module 160 and their conductive contacts.

Also as shown in FIG. 2, module 160 may further include package pads 139 on surface 134 of IC package substrate 130 at region 137. Package pads 139 may be configured such that IC die 140, the IC die that will be the subject of electrical testing by apparatus 100, may be positioned on IC package substrate 130 at region 137 such that interconnection bumps 141 are facing, aligned and in conductive contact with package pads 139.

Even if the attached known good IC die are underfilled, as discussed above for some embodiments, package pads 139 should remain exposed and capable of forming conductive contacts. In one example, region 137 may be masked or otherwise shielded during the underfill process. In another example, the underfull may be removed from region 137 after application.

When IC die 140 is placed on module 160 as shown in FIGS. 1 and 2, IC die 140 and module 160 form a "multi-die flip-chip test assembly," such as multi-die flip-chip test assembly 150 shown in FIG. 2, that may be electrically tested.

As noted above, it should be appreciated that the term "flip-chip" in the context of the present application is intended to encompass a variety of surface-to-surface die-to-substrate attach technologies. These include conventional solder bump-based flip chip technologies, such as C4 technology, as well as related technologies using lead-free or conductive epoxy materials, for example, as alternatives to conventional solder, and also copper pillar bump (CPB) technology. "Flip-chip" should be attributed this broad meaning in this application.

As stated above, module 160 is a "partially completed and validated module." Module 160 is "partially completed" in that while one or more known good IC dice may be attached to IC package substrate 130, one IC die that is the subject of electrical testing by module 160 is not attached. As shown in FIG. 2, region 137 of IC package substrate 130 does not include an attached IC die but is instead configured to accept IC die 140 for testing. In some embodiments, module 160 may have identical or similar structures as a "production multi-die flip-chip assembly," a flip-chip assembly that is sold as product or as a component of a product.

It will be appreciated that IC package substrate 130 may be any type of substrate in which IC dice may be attached. In one example, IC package substrate 130 is a 2D system-in-package (SIP) substrate. In another example, IC package substrate 130 is 2.5D substrate that includes an interposer, such as a silicon interposer with through-silicon vias (TSV's). In another example, IC package substrate 130 is a printed circuit board (PCB) in which IC dice may be directly attached.

The IC dice may one or more of any type of die, including Dynamic Random Access Memory (DRAM) dice, Static Ram (SRAM) dice, Synchronous DRAM (SDRAM) dice, microprocessor dice, Application Specific Integrated Circuit (ASIC) dice, Digital Signal Processor (DSP) dice and Field Programmable Logic Array (FPGA) dice. In a multi-die flip-chip assembly, the IC dice may be identical or have different structures or functions.

Furthermore, module 160 is "validated" in that its components and their interconnections are known to function and perform correctly. For instance, "known good die" (KGD) may have the same quality and reliability as the equivalent part in production flip-chip assemblies. In some embodiments, validation of module 160 may include testing the IC dice, the IC package substrate and interconnections between IC dice and the IC package substrate. Put another way, module 160 may be validated such that when the multi-die flip-chip test assembly fails electrical testing after an IC die is placed on module 160, it can be reasonably assumed that the placed IC die, and not module 160, was responsible for the failure.

Returning to FIG. 1, in some embodiments apparatus 100 may include a controller configured to implement a system for electrically testing IC die on the apparatus and assembling them into a production package in the same apparatus. Thus, according to these embodiments, the apparatus is configured to implement a system for electrically testing IC die on the apparatus and assembling them into a production package in the same apparatus. Controller 120 may be a computing device that is configured to control operation of apparatus 100 and its components. In one example, controller 120 may include one or more memory devices and one or more processors. The one or more memory devices may store instruction, such as computer code, that are executable by the one or more processors to control apparatus 100 in performing methods described with reference to FIGS. 2, 3, 4, 5, 6 and 7.

Pick and place tool 110 may be operable, such as by controller 120, to pick up module 160 and to place it onto substrate part holder 105 or to pick up IC die 140 (e.g., from a stack of IC dice) and to place the die onto module 160. In addition, pick and place tool 110 may also be operable to lift IC die 140 from module 160 or to lift module 160 from substrate part holder 105. In one example, pick and place tool 110 includes a suction device 111 to which IC dice and modules may attach. However, other pick and place techniques known in the art besides vacuum suction may also be used for pick and place tool 110.

In some embodiments, pick and place tool 110 may also be operable to apply pressure to a positioned test IC die. For instance, pick and place tool 110 may be operable to press down on IC die 140 after it has positioned IC die 140 on module 160. Via this technique, IC die 140 is held in position on module 160 and reliable conductive contact is made between interconnection bumps 131 and package pads 131 in a vertical arrangement for electrical testing. In other embodiments, clamps 107 or other mechanical mechanisms on substrate part holder 105 may be used for applying pressure to IC die 140. In various embodiments, a clamp may be a flat piece of material (e.g., metal) that interfaces with the die and the pressure applying arm. The flat piece helps to distribute pressure uniformly. Pressure can be applied onto this flat piece in different ways (e.g., spring loading, clamping (a regular clamp designed to deliver certain loads, etc.), as is common in the industry. A variety of clamps may be used, from simple mechanical clamps to wafer level bonders that apply uniform pressure across an entire wafer.

Substrate part holder 105 provides a platform on which module 160 may be placed. Test socket pads 106 may be located on the top surface of substrate part holder 105 and configured such that package bumps 132 of IC package substrate 130 may be aligned for conductive contact when module 160 is placed on substrate part holder 105.

In some embodiments, substrate part holder 105 also includes one or more vacuum mounts 108 that are operable to suction module 160 to substrate part holder 105. Via suctioning, the one or more vacuum mounts apply pressure that module 160 in position on substrate part holder 105. In addition, the one or more vacuum mounts may be configured to apply a sufficient amount of pressure such that package bumps 132 make reliable conductive contact with test socket pads 106 for electrical testing. In other embodiments, substrate part holder 105 may include clamps or other mechanical mechanisms for applying pressure to module 160.

In particular embodiments, IC die 140, module 160 and substrate part holder 105 are arranged in a stack (e.g., a vertical stacked arrangement) such that the application of pressure to one or more of the various components to obtain electrical contact can be done in a simple, direct way that enhances workflow and the likelihood of a reliable electrical connection at all suitable points without damage to any component.

In other embodiments, module 160 may be more permanently attached to substrate part holder 105. For instance, if package bumps 132 are made from solder, they may be reflowed to attach to test socket pads 106. Here, package bumps 132 may also be underfilled or encapsulated after attachment.

Test circuitry 115 may connect test socket pads 106 with controller 120. Test circuitry 115 is operable by controller 120 to electrically test multi-die flip-chip test assembly 150 when it is positioned on substrate part holder 105.

In some embodiments, apparatus 100 may include a heated platform. Here, pick and place tool 110 may be further configured to lift IC die 140 from module 160 after IC die 140 has passed electrical testing and to place IC die 140 on a production IC package substrate positioned on the heated platform. The heated platform may be operable, such as by controller 120, to attach an IC die that has passed electrical testing on module 160 to a production IC package substrate, such as by solder reflow of the conductive contacts. Heated platforms are discussed in further detail below with respect to FIG. 3.

Figure 3:
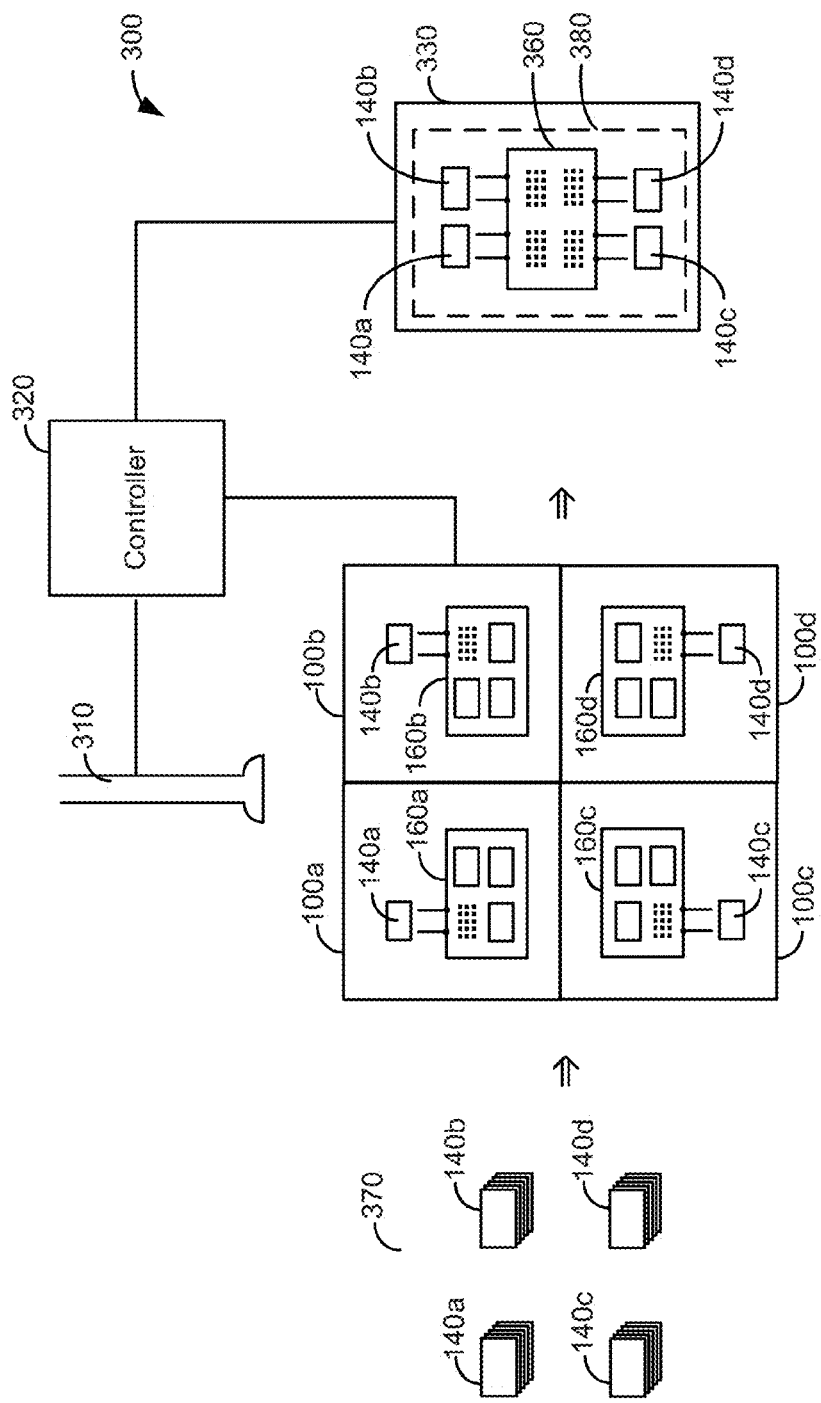
FIG. 3 shows an example test and assembly apparatus 300, configured in accordance with some embodiments.

FIG. 3 shows an example test and assembly apparatus 300 (hereinafter, "apparatus 300") for testing IC dice and packaging the IC dice in the manufacture of multi-die flip chip assembly 380. Apparatus 300 may include a plurality of test apparatus 100s, one or more pick and place tools 310, heated platform 330 and controller 320 configured to implement a system for controlling apparatus 300.

Apparatus 300 may include a test apparatus 100 for each IC die of multi-die flip-chip assembly 380. As shown, apparatus 300 is configured to package four IC dice to production IC package substrate 360, and thus includes test apparatus 100a, 100b, 100c and 100d. It will be appreciated, however, that the disclosed techniques are applicable to multi-die packages with any number of IC die.

Each test apparatus 100(a)-(d) may include a module 160 (a)-(d), respectively. As discussed above with respect to FIGS. 1 and 2, each module 160 is "partially completed" in that one IC die that is subject to electrical testing by module 160 is not attached. Here, modules 160(a)-(d) may be identical to each other except that a different IC die of multi-die flip-chip assembly 380 is not attached in each module.

Each test apparatus 100(a)-(d) may include some or all of the components of test apparatus 100 discussed above with respect to FIG. 1. In some embodiments, each test apparatus may include a controller, substrate part holder with test sockets and test circuitry. In another embodiment, controller 320 may be configured to directly control all test apparatus 100 (a)-(d) and their components. In yet another embodiment, controller 320 may be configured to control test apparatus 100(a)-(d) by interfacing with their respective controllers.

In some embodiments, one or more pick and place tools 310 may represent pick and place tools associated with each test apparatus, such as pick and place tool 110 for test apparatus 100 shown in FIG. 1. For instance, a first pick and place tool for test apparatus 100a may pick up IC die 140a from stacks 370 and place IC die 140a onto module 160a. A second pick and place tool for test apparatus 100b may pick up IC die 140b from stacks 370 and place IC die 140b onto module 160a. A third pick and place tool for test apparatus 100c may pick up IC die 140c from stacks 370 and place IC die 140c onto module 160c. A fourth pick and place tool for test apparatus 100c may pick up IC die 140c from stacks 370 and place IC die 140c onto module 160c. This embodiment may be particularly useful when the pick and place tools are also configured to apply pressure to the IC dice to form conductive contacts with the modules during electrical testing.

In some embodiments, a single pick and place tool may be operable, such as by controller 320, to pick IC dice from stacks 370 and place them on the appropriate module 160. In general, one or more pick and place tools 310 in FIG. 3 represent one or more pick and place tools that perform the picking and placing of IC dice in apparatus 300 as directed by controller 320.

After IC dice 140a, 140b, 140c and 140d are placed and electrically tested on modules 160a, 160b, 160c and 160d respectively, pick and place tool 310 may be further operable, such as by controller 320, to lift the IC dice from the modules. IC dice that failed electrical testing may be discarded. IC dice that pass electrical testing may be kept for subsequent assembly to IC package substrate 360.

Heated platform 330 may provide an assembly platform where tested IC dice, such as IC dice 140a, 140b, 140c and 140d, may be attached to production IC package substrate 360. In some embodiments, controller 320 is configured to control pick and place tool 310 to position the tested IC dice on production IC package substrate 360 for attachment at heated platform 330.

Controller 320 may be further configured to determine and control the temperature of heated platform 330, and in turn, the temperature of multi-die flip-chip assembly 380 when it is placed on heated platform 330. Via heating of multi-die flip-chip assembly 380, the IC dice may be attached to IC package substrate 360. In one example, the interconnection bumps of the IC dice and package pads of IC package substrate 360 are made from solder. Here, heating up heated platform 330 causes solder reflow and results in the interconnection bumps forming attachments to the package pads.

Figure 4:
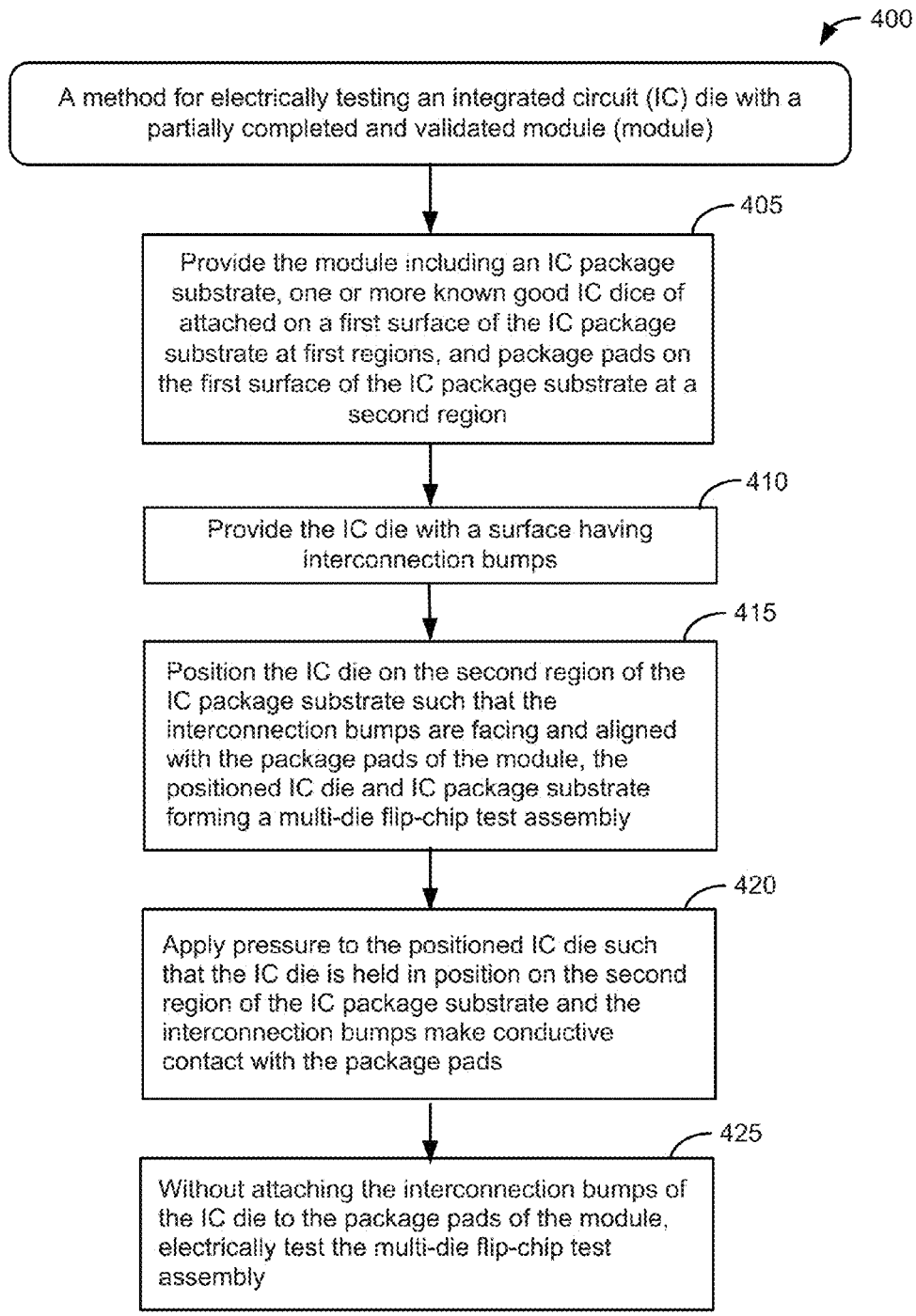
FIG. 4 shows an example of a method 400 for electrically testing an IC die with a partially completed and validated module, performed in accordance with some embodiments.

FIG. 4 shows an example of a method 400 for electrically testing an IC with a partially completed and validated module, performed in accordance with some embodiments. In some embodiments, test apparatus 100 or apparatus 300 shown in FIGS. 1 and 3 respectively may perform method 400.

In block 405, a partially completed and validated module, such as module 160 shown in FIG. 1, is provided. The module may include an IC package substrate, one or more known good IC dice attached on a first surface of the IC package substrate at first regions, and package pads on the first surface of the IC package substrate at a second region.

In some embodiments, the module may be positioned on a substrate part holder with test sockets, as shown in FIG. 1 and described in further detail with respect to FIG. 5 below.

In block 410, an IC die, such as IC die 140 shown in FIGS. 1 and 2, with a surface having interconnection bumps is provided for testing. In general, the interconnection bumps provide for conductive paths from the IC die to an IC package substrate, mechanical attachment of the IC die to the IC package substrate, as well as a variety of other functions.

As discussed, the package pads of the module are configured to be in conductive contact with the interconnection bumps of the IC die. In some embodiments, the interconnections bumps and package pads are arranged in a common pattern on the respective surfaces of the IC die and the IC package substrate.

In some embodiments, the IC die has passed a wafer test before it was cut from a wafer. However, in other embodiments, the IC die has not been tested after its fabrication in block 410.

In block 415, the IC die is positioned on the second region of the IC package substrate of the module. The IC die may be positioned such that the interconnection bumps of the IC die are facing and aligned with the package pads of the module. When the IC die is positioned on the module, the positioned IC die and module form a multi-die flip-chip test assembly.

In some embodiments, the IC die is picked from a stack of IC dice and placed on the IC package substrate as part of an assembly line process. Pick and place tool 110 or the like may be used in block 415.

In some embodiments, the interconnection bumps of the IC die are made from solder. In this case, a layer of flux may conventionally be applied between an IC die and an IC package substrate to prevent oxidation during a subsequent solder reflow. The flux may be made from an organic, non-conductive material and may be applied by virtually any technique, including spray, brush, dip or the like. Here, however, the IC die is only placed in conductive contact with the module and will not be attached, thus flux is not applied between the IC die and the module in some preferred embodiments.

In block 420, pressure is applied to the IC die positioned on the second region of the IC package substrate of the module. Here, the pressure may serve a dual mechanical and electrical purpose. First, the pressure may hold the IC package substrate in position on the surface of the substrate part holder so that the package bumps remain aligned with the test socket pads. Second, the pressure may ensure that the package bumps make and retain conductive contact with the test socket pads. The pressure should be sufficient to flatten the package substrate so that all test socket pads are in contact with their respective package bumps, and so that a good electrical contact is made between the bumps and pads. The amount of pressure that is sufficient may vary based on substrate composition, modulus and warpage, but would be readily determinable by one skilled in the art given the disclosure provided herein.

In some embodiments, the conductive contacts (e.g., interconnection bumps) of the IC die and the IC package substrate are made from solder. Solder is desirable in that it is capable of forming reliable conductive connections between two unattached conductive contacts (e.g., a bump and a pad) when sufficient pressure is applied to press the unattached conductive contacts against each other. Conductive materials that require curing, reflow or permanent attachment before reliable conductive connections form are less desirable. It will be appreciated, however, that the disclosed embodiments are not limited to solder and that other materials may be used.

In some embodiments, pick and place tool 110 applies the pressure in block 420. As discussed above with respect to block 415, pick and place tool 110 may be used to place the IC die on the second region of the IC package substrate. In one example, pick and place tool 110 may remain attached with the IC die after placement so that it may press down on the IC die and apply pressure. As discussed, controller 120 may be configured to control pick and place tool 110, which here includes controlling the amount of pressure that pick and place tool 110 applies to the IC die in block 420.

In other embodiments, a component other than pick and place tool 110 may be used to apply the pressure. In one example, clamps or other mechanical mechanisms may be used that presses the IC die on the IC package substrate. Magnetic and vacuum force may also be used in various examples.

In block 420, the multi-die flip chip test assembly is electrically tested without attaching the interconnection bumps of the IC die to the package pads of the module. Because the IC die is not attached to the module, it may be easily lifted from the module after the electrical test is completed. The module may then be reused to test a second IC die using techniques similar to those described for the first IC die.

Electrically testing the multi-die flip-chip test assembly with the module may be advantageous compared to a conventional packaging process in which components of a production multi-die flip-chip assembly are attached prior to full functional and performance tests. Here, if any single IC die has failed electrical testing, the production multi-die flip-chip assembly must be either entirely discarded or placed in a costly rework process in which malfunctioning IC dice are removed. Thus method 400 provides for a technique in which IC die may be tested on a module that simulates a production multi-die flip-chip assembly. Tests are performed on the module prior to attachment of the IC die to an actual production multi-die flip-chip assembly. As a result, higher yields are achieved and manufacturing costs are decreased.

In general, the electrical test may be configured based on the needs of the manufacturer. The electrical test should be designed such that performing the test will determine whether the IC die in question is suitable for permanently assembly.

In some embodiments, substrate part holder 105, test socket pads 106, test circuitry 115 and controller 120 shown in FIG. 1 are used to perform electrical testing in block 420. Here, module 160 may interface with test socket pads 106 via package pads 132. In other embodiments, however, the module may not include package pads and may interface with test circuitry 106 via other techniques such as test probes or permanent connections. In either case, controller 120 may store and execute computer readable instructions to control test circuitry 115 to perform the electrical testing. The results of the electrical testing may be stored in controller 120, or some other memory device, for subsequent use.

Figure 5:
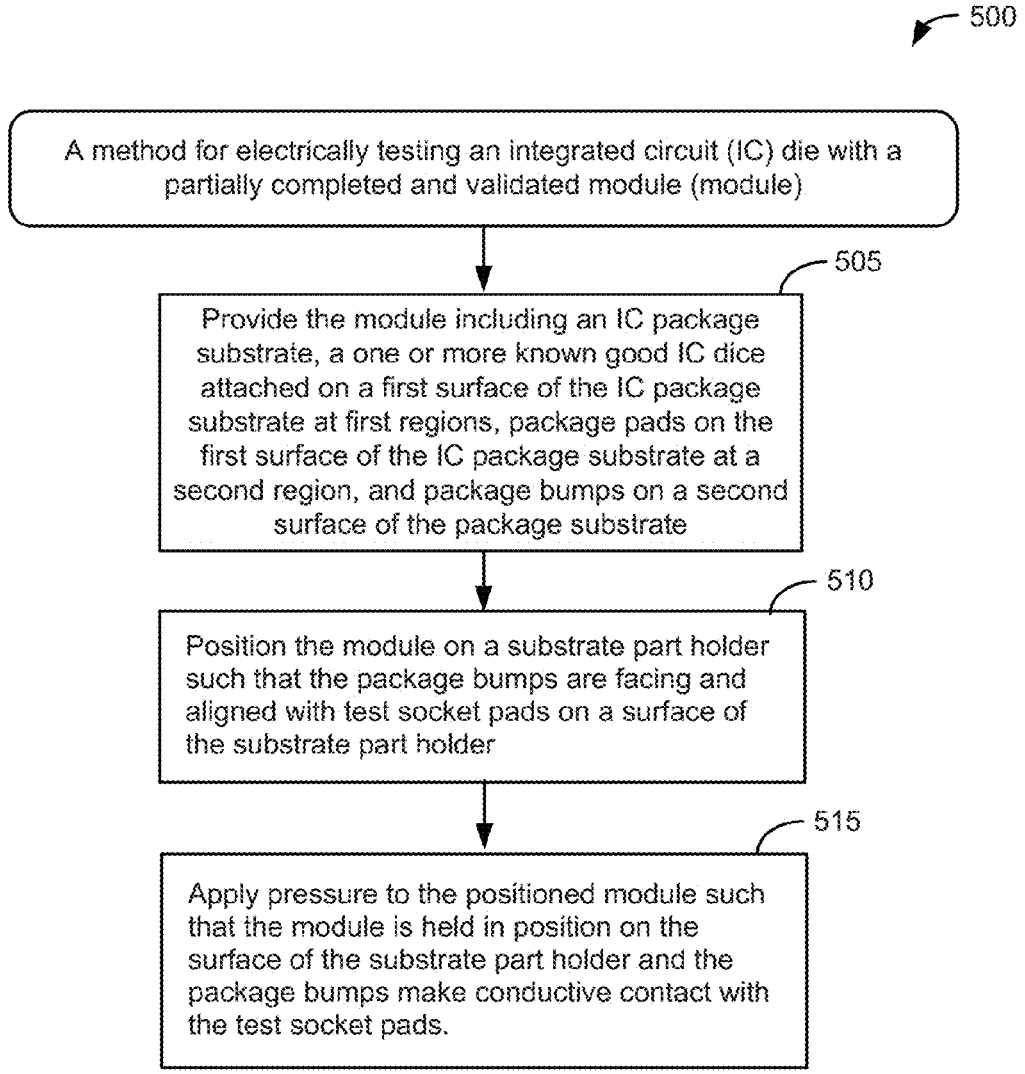
FIG. 5 shows an example of a method 500 for electrically testing an IC die with a partially completed and validated module, performed in accordance with some embodiments.

FIG. 5 shows an example of a method 500 for electrically testing an IC die with a partially completed and validated module including package bumps, performed in accordance with some embodiments. In block 505, a module is provided that is similar to the module described above in block 405 of method 400. Here, the module includes package bumps on a second surface of the package substrate, such as package bumps 132 on module 160 shown in FIG. 1.

In block 510, the module is positioned on a substrate part holder such that the package bumps are facing and aligned with test socket pads on a surface of the substrate part holder. In some embodiments, pick and place tool 110 or the like may be used for the picking and placing of IC package substrates. As discussed, the module includes package bumps on a second surface of the package substrate, thus the module may be placed on the substrate part holder such that the second surface faces the top surface of the substrate part holder where the test socket pads are located.

The test socket pads are arranged on the surface of the substrate part holder in a common pattern with the package bumps. This allows the test socket pads to interface with the module in a similar fashion as a printed circuit board (PCB) might interface with a production multi-die flip-chip assembly, thus allowing the IC die's functional compatibility with a PCB board to be tested.

In block 515, pressure is applied to the module positioned on the surface of the substrate part holder. The pressure may also serve a dual mechanical and electrical purpose. First, the pressure may hold the module in position on the surface of the substrate part holder so that the package bumps remain aligned with the test socket pads. Second, the pressure may ensure that the package bumps make and retain conductive contact with the test socket pads.

In some embodiments, substrate part holder 105 shown in FIG. 1 applies the pressure in block 515. In one example, substrate part holder includes one or more vacuum mounts that apply the pressure. A vacuum mount may include a hole on the surface of the substrate part holder that suctions the module to the surface of the substrate part holder. Controller 120 may be configured to control the amount of pressure applied by the vacuum mounts such that it is sufficient to hold the module and retain the conductive contacts.

In some embodiments, structures other than vacuum mounts on the substrate part holder may be used. For instance, clamps or other mechanical mechanisms may apply a pressure from above the module that presses the module down on the substrate part holder. The mechanical mechanism may be part of the substrate part holder, or some other component. In some embodiments, magnetic force may also be used to apply the pressure.

After the pressure is applied to the module in block 515, method 400 may be performed where an IC is placed on the module and electrically tested. In some embodiments, pressure to the module is maintained while IC dice are sequentially placed, tested, and lifted from the module.

Figure 6:
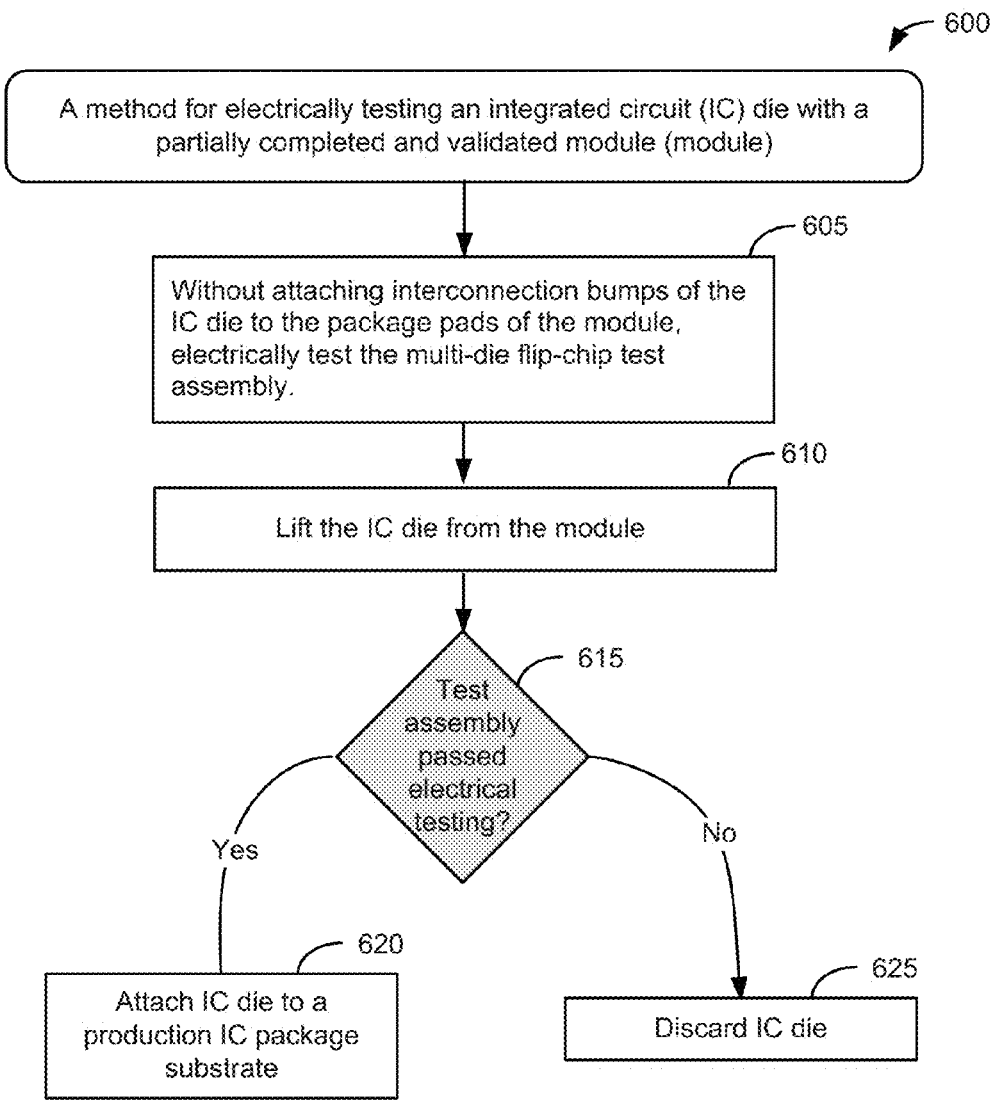
FIG. 6 shows an example of a method 600 for electrically testing an IC die with a partially completed and validated module, performed in accordance with some embodiments.

FIG. 6 shows an example of a method 600 for electrically testing an IC die with a partially completed and validated module, performed in accordance with some embodiments. In block 605, a multi-chip flip-chip test assembly, including the positioned IC die and the module, is electrically tested like in block 425 of method 400.

In block 610, the IC die is lifted from the module. In some implementations, lifting the IC die is performed by pick and place tool 110 shown in FIG. 1. Under the control of processor 120, pick and place tool 110 may lift the IC die from the module. It may further lift and position a second IC die onto the module. The second IC die may be positioned on the module and tested like the first IC die.

If the multi-die flip-chip test assembly passed electrical testing, the method proceeds from determination block 615 to block 620. Here, the IC die that is lifted from the module in block 610 may be placed on a production IC package substrate for attachment. Other IC dice that have been tested may also be placed on the production IC package substrate. In some embodiments, the other IC dice may have also been tested with a module.

In some embodiments, attachment may be performed a heated platform, such as heated platform 330 shown in FIG. 3. Here, heated platform 330 may be operated by a controller, such as controller 120 or 320, to apply controlled heating to the production multi-die flip-chip assembly, such as multi-die flip-chip assembly 380. The heating should be at a rate and a temperature that is sufficient to make conductive contacts between the IC die and the production IC package substrate form attachments. However, the temperature should be maintained such that the package bumps of the production IC package substrate do not form attachments to the heated platform. In addition, the temperature should be maintained such that the IC die, production IC package substrate and various interconnections are not damaged or otherwise functionally altered.

In some embodiments, the interconnection bumps of the IC die are made from solder. Here, applying heat in block 610 causes the solder to reflow, thus forming attachments between the interconnection bumps and the package pads. In some embodiments, the attached IC die may be further underfilled or encapsulated.

At this point, the multi-die flip-chip assembly may be complete. In some embodiments, a final electrical test may also be performed to ensure that the attachment process did not damage the multi-die flip-chip assembly. This final electrical test, if performed, may be performed before or after underfilling.

If the multi-die flip-chip assembly failed electrical testing, the method proceeds from determination block 615 to block 625, where the IC die that is lifted from the module in block 610 may be discarded.

Figure 7:
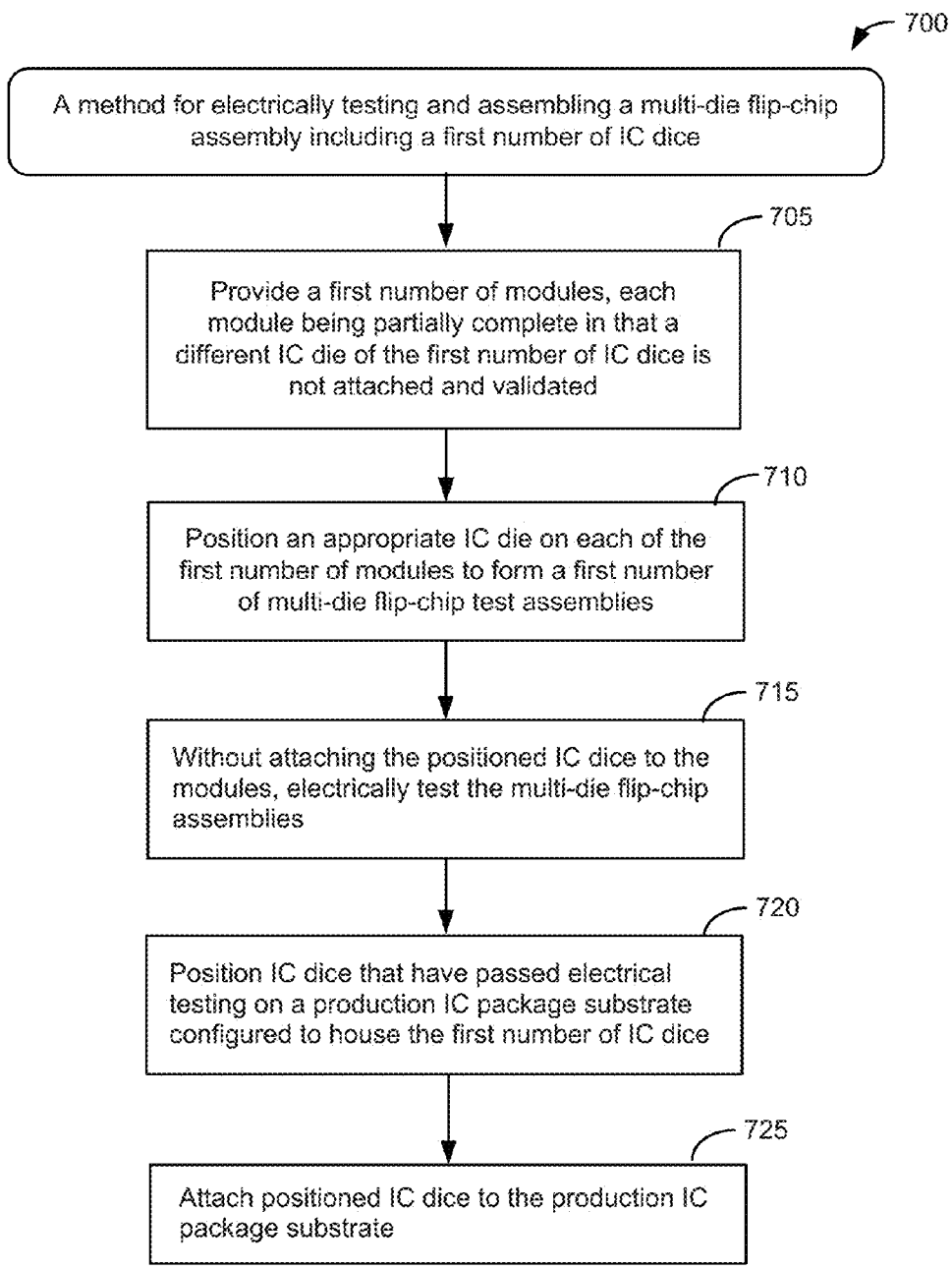
FIG. 7 shows an example of a method 700 for electrically testing and assembling a multi-die flip-chip assembly including a first number of IC dice, performed in accordance with some embodiments.

FIG. 7 shows a method 700 for electrically testing and assembling a multi-die flip-chip assembly including a first number of IC dice, performed in accordance with some embodiments. In block 705, a first number of modules are provided, each module being partially complete in that a different IC die of the first number of IC dice is not attached.

In some embodiments, method 700 may be performed with apparatus 300 shown in FIG. 3, including one or more pick and place tools 310, controller 320, heated platform 330 and test apparatus 100(*a*)-(*d*) including modules 160(*a*)-(*d*). Each test apparatus may further include a substrate part holder including test socket pads and test circuitry. In the example of FIG. 3, multi-die flip-chip assembly 380 is configured to hold four IC dice, and thus four modules 160(*a*)-(*d*) without IC dice 140(*a*)-(*d*) respectively are provided in block 705.

In block 710, an appropriate IC die is positioned on each of the first number of modules to form a first number of multi-die flip-chip test assemblies. As shown in FIG. 3, IC dice 140(*a*)-(*d*) may be positioned on modules 160(*a*)-(*d*) respectively. The discussion regarding blocks 415 and 420 in method 400 may also be applicable to block 710.

In block 715, the multi-die flip-chip test assemblies are electrically tested without attaching the positioned IC dice to the modules. The discussion regarding block 425 of method 400 may also be applicable to block 710. After testing, the IC dice may be lifted from the modules.

In block 720, the IC dice that have passed electrical testing are placed on a production IC package substrate, such as production IC package substrate 360 of multi-die flip-chip assembly 380 shown in FIG. 3. The production IC package substrate, like the IC package substrate of the module, may include a first number of regions including package pads on which IC dice 140(*a*)-(*d*) may be positioned. Failing IC dice are not placed on the production IC package substrate and may be discarded. In one example, passing IC dice are set aside for placement at a later time. In another example, passing IC dice are lifted from the module and directly placed on the production IC package substrate. Here, a previously tested IC dice may be placed on the production IC package substrate along IC dice directly lifted from the module to replace a discarded IC die.

In block 730, the IC dice positioned on the production IC package substrate are attached. The IC dice may be further cleaned, underfilled or encapsulated, at which point packaging may be complete. The discussion regarding block 620 of method 600 may also be applicable to block 730.

Although many of the components and processes are described above in the singular for convenience, it will be appreciated by one of skill in the art that multiple components and repeated processes can also be used to practice the techniques of the present invention.

While particular embodiments of the invention have been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of components and should not be restricted to the ones mentioned above. It is therefore intended that the invention be interpreted to include all variations and equivalents that fall within the true spirit and scope of the present invention.

What is claimed is:

1. An apparatus for electrically testing an IC die, comprising:
    a partially completed and validated module including:
    an IC package substrate,
    one or more known good IC dice attached on a first surface of the IC package substrate at first regions, and
    package pads on the first surface of the IC package substrate at a second region;
    a pick and place tool for positioning a test subject IC die on the second region of the IC package substrate such that interconnection bumps of the test subject IC die are facing and aligned with the package pads of the module, the positioned test subject IC die and the module forming a multi-die flip-chip test assembly; and
    test circuitry electrically connected with the module for electrically testing the multi-die flip-chip test assembly without the test subject IC die being attached to the module.

2. The apparatus of claim 1, further comprising one or more pressure application mechanisms for applying pressure to the positioned test subject IC die such that the test subject IC die is held in position on the second region of the IC package substrate and the interconnection bumps make conductive contact with the package pads.

3. The apparatus of claim 2, wherein at least one of the one or more pressure application mechanisms is the pick and place tool.

4. The apparatus of claim 1, wherein the module further includes package bumps on a second surface of the IC package substrate and wherein the pick and place tool is further for positioning the module on a substrate part holder such that the package bumps are facing and aligned with test socket pads on a surface of the substrate part holder.

5. The apparatus of claim 4, further comprising one or more pressure application mechanisms for applying pressure to the positioned module such that the module is held in position on the surface of the substrate part holder and the package bumps make conductive contact with the test socket pads.

6. The apparatus of claim 5, wherein at least one of the one or more pressure application mechanisms is a vacuum mount.

7. The apparatus of claim 5, wherein at least one of the one or more pressure application mechanisms is a clamp.

8. The apparatus of claim 1, wherein the pick and place tool is further for lifting the test subject IC die from the module after the multi-die flip-chip test assembly has been electrically tested, thereby allowing a second test subject IC die to be positioned on the module for testing.

9. The apparatus of claim 8, further comprising a heated platform, wherein responsive to the multi-die flip-chip test assembly passing electrical testing:
    the pick and place tool is further for positioning the test subject IC die on a second region of a production IC package substrate such that the interconnection bumps of the IC die are facing and aligned with production package pads of the production IC package substrate, and
    the heated platform is for attaching the test subject IC die to the production IC package substrate.

10. The apparatus of claim 8, further comprising:
    a controller, comprising one or more memory devices and one or more processors, the one or more memory devices storing instructions executable by the one or more processors such that the controller is for:
        controlling the pick and place tool to position the test subject IC die on the second region of the IC package substrate such that interconnection bumps of the IC die are facing and aligned with the package pads of the module, the positioned test subject IC die and the module forming a multi-die flip-chip test assembly; and
        controlling the test circuitry to electrically test the multi-die flip-chip test assembly without the test subject IC die being attached to the module.

11. The apparatus of claim 10, wherein the controller is further for controlling the pick and place tool to lift the test subject IC die from the module after the multi-die flip-chip test assembly has been electrically tested, thereby allowing a second test subject IC die to be positioned on the module for testing.

12. The apparatus of claim 10, further comprising a heated platform and wherein the controller is further for:
    responsive to the multi-die flip-chip test assembly passing electrical testing:
    control the pick and place tool to position the test subject IC die on a second region of a production IC package substrate such that the interconnection bumps of the IC die are facing and aligned with production package pads of the production IC package substrate, and
    control the heated platform to attach the test subject IC die to the production IC package substrate.

* * * * *